US012635439B2

(12) United States Patent
Piluso et al.

(10) Patent No.: US 12,635,439 B2
(45) Date of Patent: May 19, 2026

(54) PROCESS FOR MANUFACTURING A SILICON CARBIDE SEMICONDUCTOR DEVICE HAVING IMPROVED CHARACTERISTICS

(71) Applicant: STMicroelectronics S.r.l., Agrate Brianza (IT)

(72) Inventors: Nicolo' Piluso, Catania (IT); Andrea Severino, Aci Sant'Antonio (IT); Stefania Rinaldi Beatrice, San Pietro Clarenza (IT); AngeloAnnibale Mazzeo, Catania (IT); Leonardo Caudo, Bernareggio (IT); Alfio Russo, Biancavilla (IT); Giovanni Franco, Viagrande (IT); Anna Bassi, Gravina di Catania (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 230 days.

(21) Appl. No.: 17/368,437

(22) Filed: Jul. 6, 2021

(65) Prior Publication Data

US 2022/0005702 A1    Jan. 6, 2022

(30) Foreign Application Priority Data

Jul. 6, 2020    (IT) ........................ 102020000016279

(51) Int. Cl.
 *H01L 21/306* (2006.01)
 *H01L 21/02* (2006.01)
 *H10D 62/832* (2025.01)

(52) U.S. Cl.
 CPC .. *H01L 21/30625* (2013.01); *H01L 21/02057* (2013.01); *H01L 21/02236* (2013.01);
 (Continued)

(58) Field of Classification Search
 CPC ......... H01L 21/30625; H01L 21/02057; H01L 21/02236; H01L 21/02378; H01L 21/02529; H01L 21/0262; H01L 29/1608
 See application file for complete search history.

(56) References Cited

U.S. PATENT DOCUMENTS

2002/0127951 A1* 9/2002 Ishikawa ............... B24B 37/013
                                                        451/6
2006/0011128 A1   1/2006 Ellison et al.
                    (Continued)

FOREIGN PATENT DOCUMENTS

CA    2757205 A1    5/2011
CN    1892984 A     1/2007
          (Continued)

OTHER PUBLICATIONS

Kimoto, "Material science and device physics in SiC technology for high-voltage power devices," *Japanese Journal of Applied Physics* 54:040103, 2015, 28 pages.
(Continued)

*Primary Examiner* — Julia Slutsker
(74) *Attorney, Agent, or Firm* — Seed Intellectual Property Law Group LLP

(57) ABSTRACT

A process for manufacturing a silicon carbide semiconductor device includes providing a silicon carbide wafer, having a substrate. An epitaxial growth for formation of an epitaxial layer, having a top surface, is carried out on the substrate. Following upon the step of carrying out an epitaxial growth, the process includes the step of removing a surface portion of the epitaxial layer starting from the top surface so as to remove surface damages present at the top surface as a result of propagation of dislocations from the substrate during the previous epitaxial growth and so as to define a resulting top surface substantially free of defects.

17 Claims, 4 Drawing Sheets

(52) U.S. Cl.
CPC .. *H01L 21/02378* (2013.01); *H01L 21/02529* (2013.01); *H01L 21/0262* (2013.01); *H10D 62/8325* (2025.01)

(56) References Cited

U.S. PATENT DOCUMENTS

| | | | |
|---|---|---|---|
| 2011/0221039 A1 | 9/2011 | Singh et al. | |
| 2013/0213437 A1* | 8/2013 | Ishii | H01L 21/68728 |
| | | | 15/97.1 |
| 2014/0001490 A1* | 1/2014 | Konstantinov | H01L 29/0692 |
| | | | 257/77 |
| 2015/0294895 A1* | 10/2015 | Carothers | H01L 21/02178 |
| | | | 438/400 |
| 2016/0020246 A1 | 1/2016 | Wang et al. | |
| 2017/0121850 A1 | 5/2017 | Miyazaki | |
| 2018/0096854 A1* | 4/2018 | Wada | H01L 21/02433 |
| 2019/0010356 A1* | 1/2019 | Singh | C09K 3/1409 |
| 2020/0013858 A1* | 1/2020 | Itoh | H01L 29/045 |
| 2020/0384603 A1* | 12/2020 | Chiou | B24B 37/24 |
| 2022/0415653 A1* | 12/2022 | Biard | H01L 21/02447 |
| 2023/0147932 A1* | 5/2023 | Tarui | H10D 30/665 |
| | | | 257/77 |

FOREIGN PATENT DOCUMENTS

| | | | |
|---|---|---|---|
| CN | 101791781 A | 8/2010 |
| CN | 103515452 A | 1/2014 |
| CN | 105762175 A | 7/2016 |
| CN | 106536793 A | 3/2017 |
| CN | 107430995 A | 12/2017 |
| CN | 110214363 A | 9/2019 |
| CN | 111094482 A | 5/2020 |
| JP | 2010182782 A | 8/2010 |
| WO | 2005093137 A1 | 10/2005 |
| WO | 2007074734 A1 | 7/2007 |
| WO | 2010090024 A1 | 8/2010 |
| WO | 2011024854 A1 | 3/2011 |
| WO | 2013051555 A1 | 4/2013 |
| WO | 2016125404 A1 | 8/2016 |
| WO | 2016185819 A1 | 11/2016 |
| WO | 2017/212971 A1 | 12/2017 |

OTHER PUBLICATIONS

Piluso et al., "Growth of 4H—SiC Epitaxial Layer through Optimization of Buffer Layer," *Materials Science Forum*, vol. 924, pp. 84-87, 2018 Trans Tech Publications Ltd, Switzerland.
Piluso et al., "High Quality 4H—SiC Epitaxial Layer by Tuning CVD Process," *Materials Science Forum*, vol. 963, pp. 91-96, 2019 Trans Tech Publications Ltd, Switzerland.
Senzaki et al., "Challenges of high-performance and high-reliability in SiC MOS structures," *Materials Science Forum*, vols. 717-720, pp. 703-708, 2012 Trans Tech Publications Ltd, Switzerland.
Mao et al., "Research on Rapid Epitaxial Growth and Etching Process of SiC Thick Films", Functional Materials, Issue 01, Jan. 30, 2017, pp. 01139-01143 (with English abstract).

* cited by examiner

PROCESS FOR MANUFACTURING A SILICON CARBIDE SEMICONDUCTOR DEVICE HAVING IMPROVED CHARACTERISTICS

BACKGROUND

Technical Field

The present disclosure relates to a process for manufacturing a silicon carbide semiconductor device having improved characteristics.

Description of the Related Art

Electronic semiconductor devices are known, for example diodes or MOSFETs (Metal Oxide Semiconductor Field-Effect Transistors), in particular for electronic power applications, made starting from a silicon carbide substrate.

The above devices prove advantageous thanks to the favorable chemico-physical properties of silicon carbide. For instance, silicon carbide generally has a wider bandgap than silicon, which is commonly used in electronic power devices. Consequently, also with relatively small thicknesses, silicon carbide has a breakdown voltage higher than that of silicon and may therefore be advantageously used in high-voltage, high-power, and high-temperature applications.

Manufacturing of a silicon carbide semiconductor device is, however, affected by some problems.

For instance, problems of crystallographic quality of silicon carbide may represent an obstacle to achieving high production yields, which in general prove lower than similar devices obtained starting from silicon, consequently causing an increase in the production costs.

In particular, epitaxial processes generally used for device manufacturing tend to propagate crystallographic defects buried in the starting substrate towards the surface of the grown epitaxial layers.

In detail, propagation of TSDs (Threading-Screw Dislocations) from the substrate towards the epitaxial layer may generate, on the surface of the same epitaxial layer, pits or nano-pits (i.e., pits having nanometric dimensions, with a diameter of few nanometres, for example less than 30 nm).

It has been shown that the presence of such defects entails a reduction of the device electrical performance and in particular a drop in reliability, with a consequent reduction of the yield after electrical testing, with possible generation of high leakage currents in conditions of reverse biasing.

The aforesaid problems are particularly important for certain applications, in particular in the automotive field, where extremely low percentages of failure are allowed (for example, less than 1%) during effective use of the devices (in the example, on board a motor vehicle).

FIG. 1 shows schematically a wafer 1 of semiconductor material, in particular silicon carbide (SiC), comprising a substrate 2, on which an epitaxial layer 3, having a top surface 3a, is grown, in particular with a homo-epitaxial process. A defect, in particular a TSD, designated by 4, propagates starting from the substrate 2 (as indicated by the arrow) towards the overlying epitaxial layer 3, generating, on its top surface 3a, a surface pit 5.

The presence of the surface pit 5, in particular if in the active area of a corresponding power device, for example a diode or MOSFET, formed in the epitaxial layer 3, may lead to a drop in the performance and reliability of the power device; for example, the surface pit 5 may jeopardize proper growth of subsequent layers on the top surface 3a of the epitaxial layer 3, for example a dielectric layer grown via surface oxidation and/or a conductive layer designed for formation of electrodes of the power device, thus jeopardizing reliability of the power device.

Studies and experimental test—see, for example, T. Kimoto, "Material science and device physics in SiC technology for high-voltage power devices," Japanese Journal of Applied Physics 54, 040103 (2015)—have confirmed that the presence of the aforesaid surface pits (nano-pits), originating from propagation of dislocations from the substrate, effectively jeopardizes device performance.

In this regard, FIGS. 2A and 2B show plots of the leakage current $I_{leak}$ as the reverse-biasing voltage $V_r$ increases for a power device (in this case, a Schottky diode) made starting from a silicon carbide substrate, in the case where nano-pits are present in the active area as a result of the propagation of dislocations from the substrate (FIG. 2A), and in the case where there are dislocations, but these dislocations do not entail the presence of surface pits (FIG. 2B). From an examination of FIGS. 2A and 2B it is evident that the leakage current is sensibly higher in the presence of surface pits in the active area, as compared to the case where, even in the presence of dislocations through the substrate, surface pits are not present.

Solutions that have so far been proposed to overcome the problem highlighted (see, for example, N. Piluso, A. Campione, S. Lorenti, A. Severino, G. Arena, S. Coffa, F. La Via, "High Quality 4H—SiC Epitaxial Layer by Tuning CVD Process," Materials Science Forum, ISSN: 1662-9752, Vol. 963, pp. 91-96), and in particular for reducing the effect of defects on the surface of the epitaxial layer, envisage appropriate steps aimed at improving the epitaxial growth performed starting from the silicon carbide substrate. However, since TSDs are defects of a crystallographic nature, it is not possible to prevent propagation thereof towards the epitaxial layer.

Other known solutions (see, for example, N. Piluso, A. Severino, R. Anzalone, M. A. Di Stefano, E. Fontana, M. Salanitri, S. Lorenti, A. Campione, P. Fiorenza, F. La Via, "Growth of 4H—SiC Epitaxial Layer through Optimization of Buffer Layer," Materials Science Forum, ISSN: 1662-9752, Vol. 924, pp. 84-87) envisage introduction of buffer layers, interposed between the substrate and the epitaxial layer; however, also these solutions enable at most a limited reduction of the density of dislocations, but do not arrest propagation of the same dislocations towards the surface of the epitaxial layer.

The need is therefore certainly felt to provide a solution that will enable reduction of the disadvantages linked to propagation of the crystallographic defects, in particular TSDs, towards the surface of the epitaxial layer grown on the silicon carbide substrate.

BRIEF SUMMARY

In various embodiments, the present solution provides a process for manufacturing a silicon carbide semiconductor device, which will enable the disadvantages highlighted previously to be overcome.

In at least one embodiment, the present disclosure provides a process for manufacturing a silicon carbide semiconductor device, comprising: providing a silicon carbide wafer, having a substrate; carrying out an epitaxial growth for formation on the substrate of an epitaxial layer, having a top surface, propagation of dislocations from the substrate towards the top surface occurring during said epitaxial growth with consequent formation of surface damages; and subsequent to the carrying out the epitaxial growth, removing a surface portion of the epitaxial layer starting from said top surface, so as to remove the surface damages at said top surface and define a resulting top surface substantially free of defects.

In at least one embodiment, the present disclosure provides a method that includes: forming an epitaxial layer on a silicon carbide substrate, a threading-screw dislocation defect in the substrate extending through the epitaxial layer and forming a pit at a surface of the epitaxial layer having a diameter less than 30 nm; and removing the pit at the surface of the epitaxial layer by performing Chemical Mechanical Polishing (CMP) to remove a surface portion of the epitaxial layer, thereby defining a top surface of the epitaxial layer that is substantially free of defects.

In at least one embodiment, the present disclosure provides a method that includes: forming an epitaxial layer on a silicon carbide substrate, a threading-screw dislocation defect in the substrate extending through the epitaxial layer and forming a pit at a surface of the epitaxial layer having a diameter less than 30 nm; removing the pit at the surface of the epitaxial layer by performing Chemical Mechanical Polishing (CMP) to remove a surface portion of the epitaxial layer, thereby defining a top surface of the epitaxial layer that is substantially free of defects; and washing the resulting top surface. Following the washing, the resulting top surface has a value of roughness lower than 0.1 nm.

BRIEF DESCRIPTION OF THE SEVERAL VIEWS OF THE DRAWINGS

For a better understanding of the present invention, preferred embodiments thereof are now described, purely by way of non-limiting example and with reference to the attached drawings, wherein.

DETAILED DESCRIPTION

As will be discussed in detail in what follows, an aspect of the present solution, instead of following the approach of known solutions acting on stopping or reducing propagation of defects (in particular, TSDs), envisages intervening on reducing the morphological damage generated on the surface by propagation of the same defects, in particular on reducing the pits (nano-pits) generated on the epitaxial layer surface.

The solution proposed allows to improve subsequent processing operations envisaged by the manufacturing process on the epitaxial layer, for example an oxidation step for the growth of a dielectric layer on the epitaxial layer, preventing effects of electrical-field crowding and ensuring a uniform oxidation.

According to an aspect of the present solution, an additional CMP step is introduced into the manufacturing process, i.e., a step of chemical-mechanical polishing of the surface of the epitaxial layer formed on the silicon carbide substrate. This process step, with the associated surface machining (which is a combination of chemical etching and mechanical planarization) enables removal of a thin superficial layer of material (of the order of hundreds of nanometres starting from the surface of the epitaxial layer), consequently making the surface of the epitaxial layer substantially free of pits. The pits due to propagation of the TSDs are substantially removed entirely with removal of the aforesaid superficial layer of material.

Figure 3:
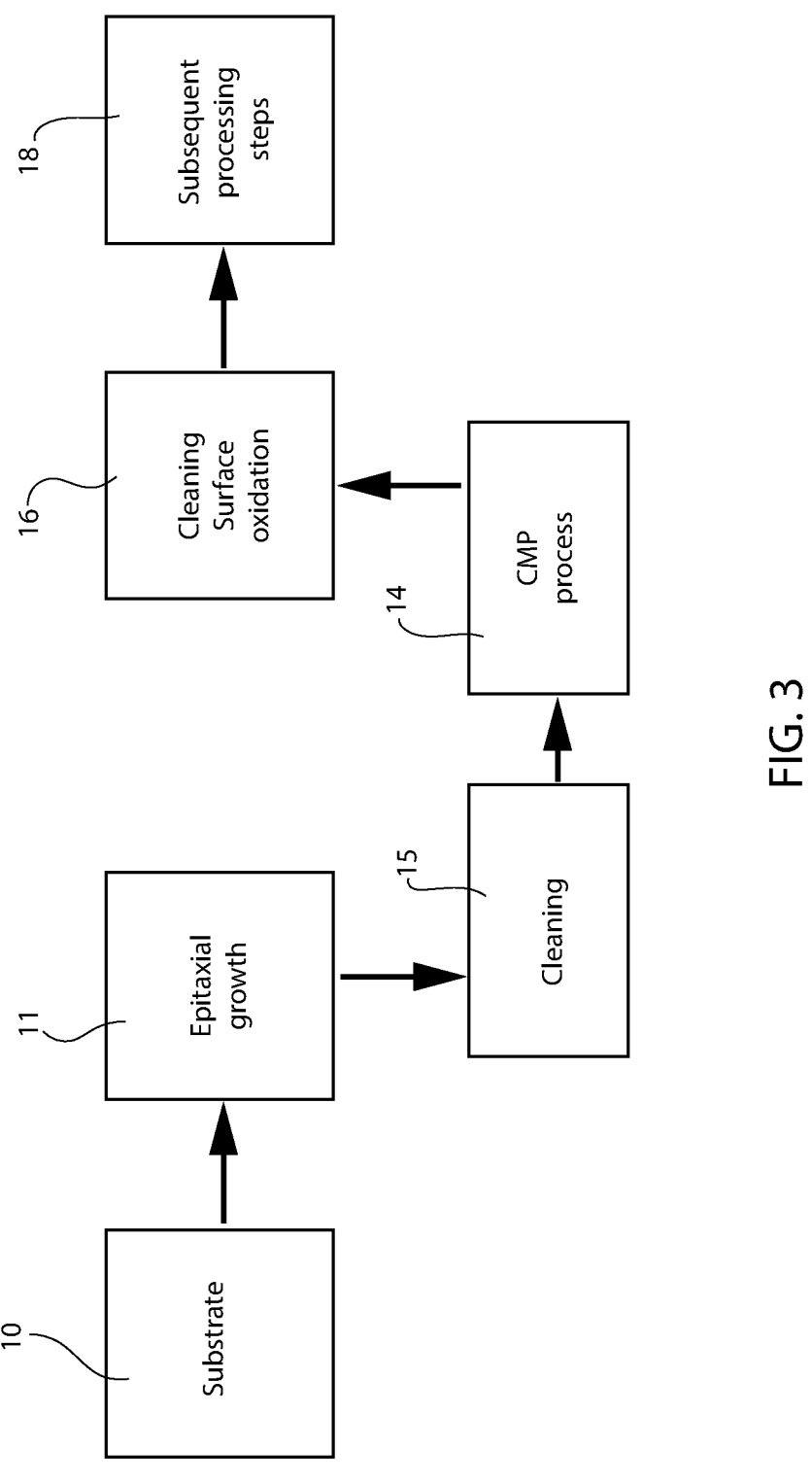
FIG. 3 shows a simplified flowchart of operations according to a process for manufacturing a silicon carbide semiconductor device according to the present solution.

With reference to FIG. 3, a process for manufacturing a generic silicon carbide semiconductor device, for example a power device (such as a diode or a MOSFET) is now described.

Figure 1:
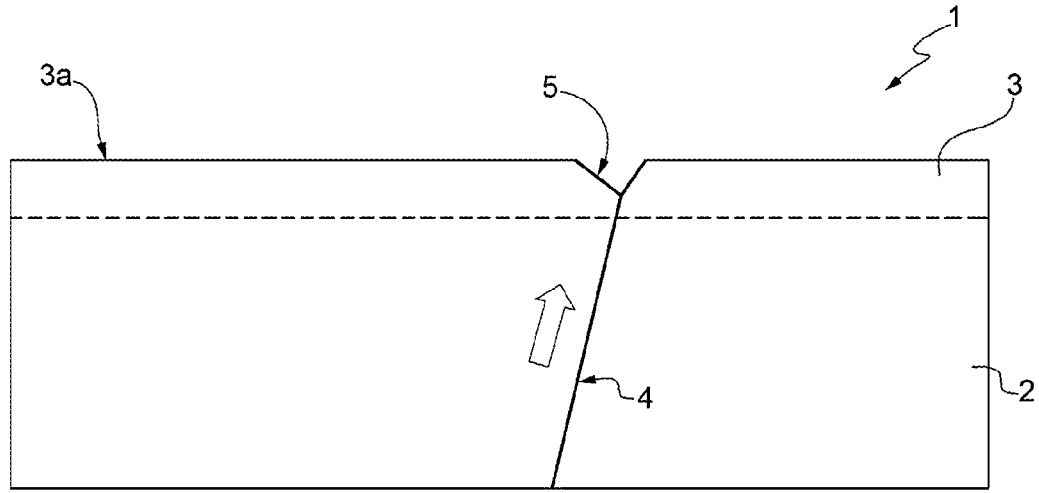
FIG. 1 is a schematic and simplified cross-sectional view of a portion of a silicon carbide semiconductor device.
Figure 2A:
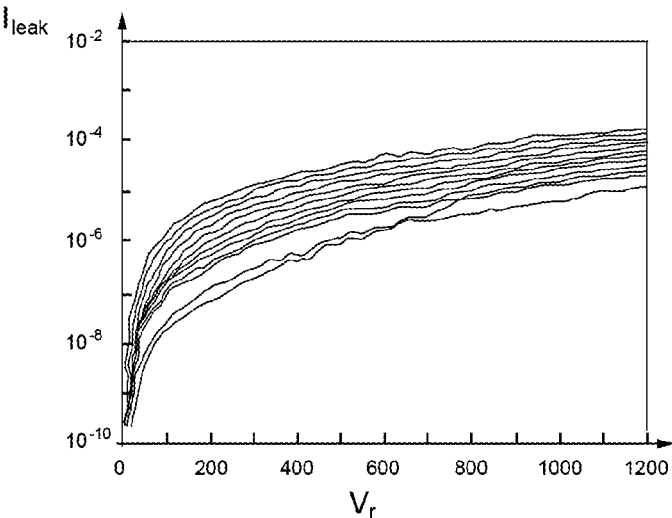
FIGS. 2A and 2B show plots of leakage currents in the semiconductor device, associated to the presence of surface defects.
Figures 2B, 4A, 4B:
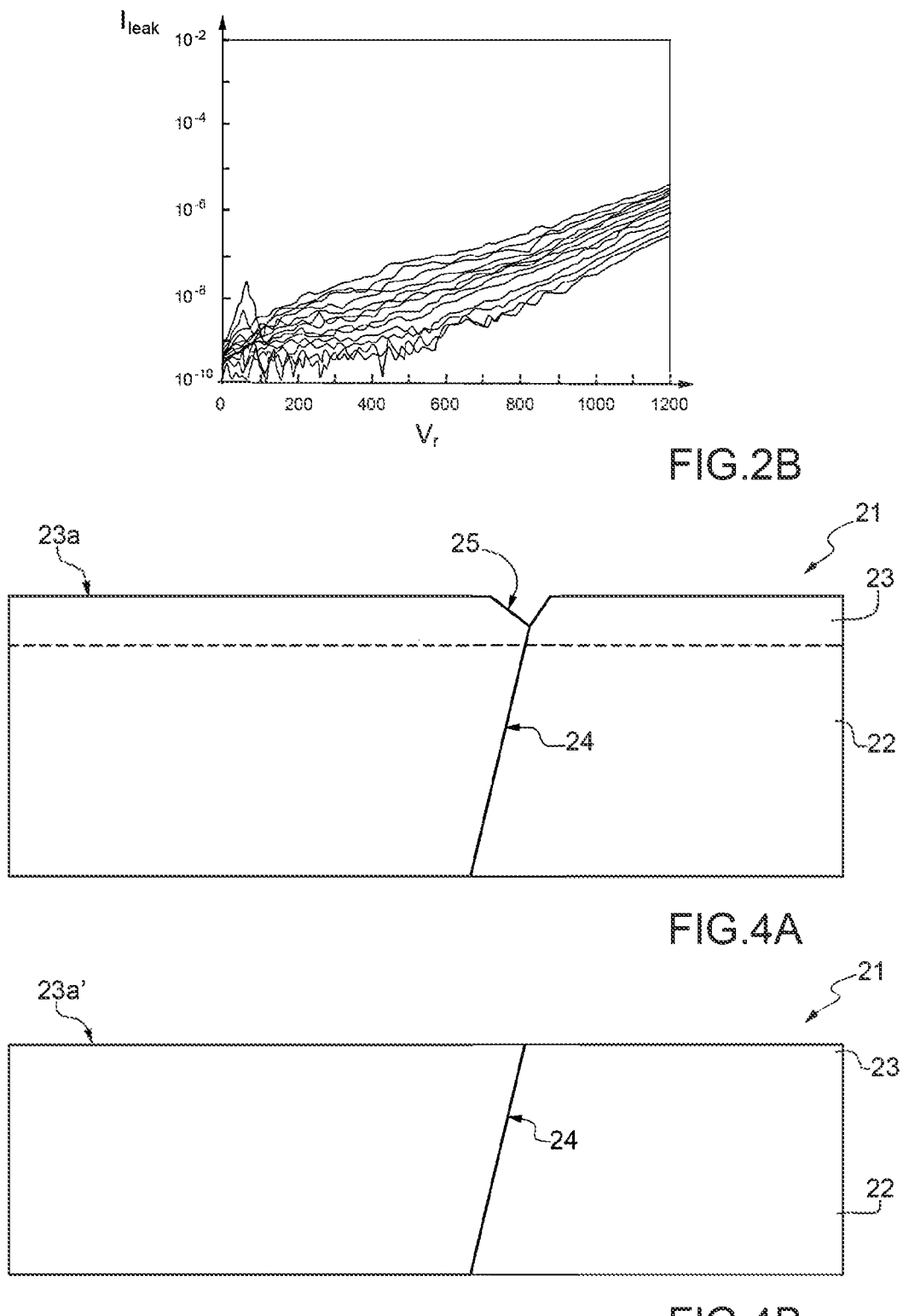
FIGS. 4A and 4B are a schematic and simplified cross-sectional views of a portion of a silicon carbide semiconductor device, during respective steps of the manufacturing process according to the present solution.

As indicated at step 10, the process first envisages providing a wafer 21 of silicon carbide (in particular 4H—SiC), comprising a substrate 22 (which is illustrated schematically in FIG. 4A). Next (step 11), an epitaxial growth is carried out, for example with Chemical Vapor Deposition (CVD), for the formation, on the substrate 22, of an epitaxial layer (once again of 4H—SiC) 23, having a top surface 23*a*.

As discussed previously, a defect, in particular a TSD, designated as a whole by 24 in FIG. 4A, during epitaxial growth may propagate starting from the substrate 22 towards the overlying epitaxial layer 23, generating, on its top surface 23*a*, a surface pit 25, which may, for example, have a diameter of some nanometres (for example, less than 30 nm).

According to an aspect of the present solution, the manufacturing process envisages, following upon the aforesaid step of epitaxial growth (in particular, immediately after), an additional step, designated by 14 in FIG. 3, of Chemical Mechanical Polishing (CMP), so-called "soft," of the top surface 23*a* of the epitaxial layer 23 formed on the substrate 22.

As indicated again in FIG. 3, the CMP process is preceded by a step, designated by 15, of cleaning of the wafer surface, in particular of the top surface 23*a* of the aforesaid epitaxial layer 23; cleaning is, for example, obtained via a jet of water at a high pressure and drying of the surface via rotation of the sample, or, alternatively via the use of chemical agents, such as HF, NH$_4$OH, H$_2$O$_2$, HCl.

As illustrated schematically in FIG. 4B, the CMP process, via combination of chemical and mechanical effects, causes removal of a thin surface layer of the epitaxial layer 23, starting from its top surface 23*a*, so as to remove the surface pits 25 originated by propagation of the TSDs 24, consequently making the resulting top surface of the epitaxial layer 23, designated by 23*a'*, substantially planar and free of defects.

In detail, the thickness of the surface layer removed (considered in a direction orthogonal to the aforesaid top surface 23*a*) may be comprised between 100 nm and 500 nm, for example 300 nm, it being in any case sufficient to remove, as mentioned previously, the surface pits 25, possibly entirely.

As it will be clear, the actual thickness of the removed surface layer will result from a compromise between the desire to remove as little material as possible (so as to optimize times and costs of the manufacturing process) and, at the same time, assure a complete removal of the surface defectiveness. The present Applicant has found that removal of a layer of a thickness of 100 nm may in general be sufficient to make the top surface 23a' resulting from the CMP process uniform. However, it may be convenient to remove a greater thickness, for example of 300 nm, in order to have a higher certainty that the desired results are obtained.

In any case, the CMP process has the further advantage of reducing the surface roughness of the aforesaid resulting top surface 23a' of the epitaxial layer 23.

In this regard, it is known that the typical roughness (generally denoted as parameter Rq) measured on the top surface of an epitaxial layer is variable between 0.1 nm and 1 nm; moreover, there frequently arises a phenomenon known as "step bunching," i.e., of formation of surface steps, basically due to CVD epitaxial growth on "off-axis" substrates.

The present Applicant has found that the aforesaid CMP process enables a marked reduction of the roughness value of the resulting top surface 23a', with values of the Rq parameter of even less than 0.1 nm (i.e., values comparable with the noise of the instrumentation used for detecting the same thickness), and moreover enables complete elimination of the step-bunching phenomenon.

Basically, the resulting top surface 23a', after the CMP process, is optimized and prepared for the subsequent chemical and/or mechanical processing steps, which may be envisaged for manufacturing of an electronic device (for example, a power device, such as a diode or a MOSFET).

In this regard, with reference again to FIG. 3, the manufacturing process envisages, following the aforesaid CMP process, a step, designated by 16, of cleaning of the resulting top surface 23a' of the epitaxial layer, in particular via $C_6H_8O_7$ and $H_2O_2$, and subsequently a standard process of oxidation of the same resulting top surface 23a', for formation of an oxide layer on the epitaxial layer 23.

Advantageously, the physical/chemical properties of the formed oxide layer are optimized thanks to the absence of defects and to the low roughness of the starting surface (the aforesaid resulting top surface 23a').

As indicated generically at step 18, the manufacturing process may then proceed with processing operations (known and not described in detail herein) required or otherwise desired for formation of the desired power device, for example steps of formation and definition of conductive layers for providing electrodes, formation of passivation layers, etc.

It will thus be noted that the proposed solution differ from pre-existing solutions substantially for the fact of envisaging the additional CMP process step (with standard preliminary cleaning and subsequent dedicated cleaning), therefore not involving a substantial increase in terms of costs or times of the manufacturing process.

The present Applicant has moreover found that it is possible to configure appropriately the CMP process (in particular, in terms of the process parameters and in terms of the used consumables), so that the same CMP process will not cause defects, such as scratches or the like, on the resulting top surface 23a' of the epitaxial layer 23.

Figure 5:
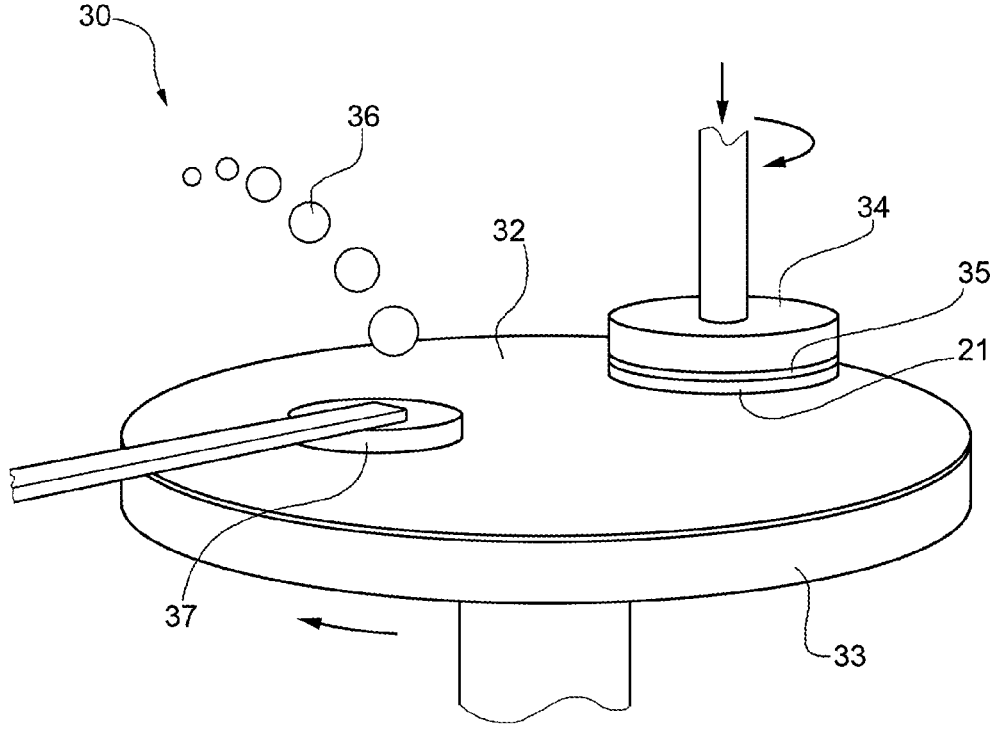
FIG. 5 is a schematic representation of a CMP (Chemical Mechanical Polishing) system, used during a process for manufacturing a silicon carbide semiconductor device according to the present solution.

In this regard, FIG. 5 shows a system 30 for implementation of the CMP process on the silicon carbide wafer, again designated by 21, which has already undergone the step of epitaxial growth for formation of the epitaxial layer 23 on the corresponding substrate 22.

In particular, the system 30 comprises a polishing pad 32 carried by a rotating support 33, which causes rotation thereof at a certain speed; the wafer 21 is set in contact with the polishing pad 32 by a supporting head 34 (to which it is attached by a fixing layer 35); the supporting head 34, in addition to rotating about its axis of rotation, exerts a force to press the wafer 21 on the polishing pad 32.

A polishing compound (so-called "slurry") 36 is made to flow over the surface of the polishing pad 32 so as to come into contact, thanks to rotation of the same polishing pad 32, with the wafer 21 in order to abrade its surface and cause chemical etching thereof.

Moreover, a conditioner pad 37 supported in cantilever fashion above the surface of the polishing pad 32, implements cleaning of the polishing pad 32 to clean it from residues possibly trapped on its surface and consequently to prevent any scratching of the wafer 21.

The present Applicant has found experimentally that it is possible to achieve better electrical and physical characteristics after the CMP process, using a particle-free polishing compound 35 having a pH<5.

In addition, a pressure P exerted by the supporting head 34 on the polishing pad 32 comprised between 1 and 3 psi has been found to be optimal, as likewise a temperature T of the CMP process lower than 50° C.

The present Applicant has moreover found that using one or more of the following further parameters of the CMP process is advantageous: rate of rotation of the polishing pad 32 less than 70 rpm; rate of rotation of the supporting head 34 less than 60 rpm; force of thrust of the conditioner pad 37 on the polishing pad approximately 6 lbf (i.e., around 3 kgf); flow of the polishing compound 36 less than 100 ml/min.

The advantages of the proposed solution emerge clearly from the foregoing description.

In any case, it is underlined that the process described enables, by introduction of the CMP process step subsequent to epitaxial growth, removal of the surface defects and therefore optimal preparation of the resulting top surface of the wafer for the subsequent processing operations for manufacturing of the semiconductor device (for example, enabling an increase in the robustness of oxide layers subsequently grown on the epitaxial layer).

In particular, the aforesaid CMP process enables elimination of surface pits due to propagation of the dislocations coming from the substrate generated during the step of epitaxial growth. Furthermore, the CMP process has the further advantage of reducing the surface roughness and in particular the so-called step-bunching phenomenon. As mentioned previously, the surface roughness of the resulting top surface 23a' following upon CMP has low values, in particular with values of the Rq parameter of less than 0.5 nm, preferably less than 0.2 nm, and even more preferably less than 0.1 nm. Moreover, advantageously, the aforesaid CMP process may be configured so as not to cause scratches or surface defects, as discussed previously and as demonstrated by the experimental tests conducted by the present Applicant.

Consequently, the present solution enables an increase in the electrical yield associated to the manufacturing process, a saving in manufacturing costs, and moreover a saving of area.

Finally, it is clear that modifications and variations may be made to what has been described and illustrated herein, without thereby departing from the scope of the present invention, as defined in the appended claims.

In particular, it is underlined that the process described may find advantageous application for any device (diodes, MOSFETs, etc.) obtained starting from a silicon carbide (SiC) substrate, on which an epitaxial growth is carried out during the processing steps envisaged for manufacturing of the same device.

A process for manufacturing a silicon carbide semiconductor device may be summarized as including:

providing a silicon carbide wafer (21), having a substrate (22); and carrying out an epitaxial growth for formation on the substrate (22) of an epitaxial layer (23), having a top surface (23*a*), propagation of dislocations (24) from the substrate (22) towards the top surface (23*a*) occurring during said epitaxial growth with consequent formation of surface damages, and subsequent to the step of carrying out an epitaxial growth: removing a surface portion of the epitaxial layer (23) starting from said top surface (23*a*), so as to remove the surface damages at said top surface (23*a*) and define a resulting top surface (23*a'*) substantially free of defects.

Said surface damages may be pits (25) due to propagation of the dislocations (24) starting from said substrate (22) towards said top surface (23*a*) during said epitaxial growth.

The removed surface portion of the epitaxial layer (23) may have a thickness comprised between 100 nm and 500 nm.

Said thickness may be equal to 300 nm.

The step of removing may include carrying out a step of Chemical Mechanical Polishing—CMP—of the top surface (23*a*) of the epitaxial layer (23).

Said CMP step may be carried out using a polishing compound (36) free of particles and having a pH lower than 5. During said CMP step, the wafer (21) may be pressed against a polishing pad (32) by a supporting head (34) with a pressure (P) comprised between 1 and 3 psi.

Said CMP step may be moreover carried out with one or more of the following parameters: rate of rotation of the polishing pad (32)<70 rpm; rate of rotation of the supporting head (34)<60 rpm; force of thrust of the supporting head (34) on the polishing pad (32) about 3 kgf; flow of the polishing compound (36)<100 ml/min.

Said CMP step may be carried out at a temperature (T) lower than 50° C.

The process may further include prior to said CMP step, cleaning of the top surface (23*a*) of the epitaxial layer (23); and moreover, subsequent to said CMP step, a dedicated washing of the resulting top surface (23*a'*); wherein, following upon said CMP step and said dedicated washing, the resulting top surface (23*a'*) has a value of roughness (Rq) lower than 0.1 nm.

Said epitaxial growth may be carried out with Chemical Vapour Deposition—CVD.

Said epitaxial layer (23) may be made of 4H—SiC.

The process may further include following upon the step of removing a surface portion of the epitaxial layer (23), carrying out further processing operations starting from the resulting top surface (23*a'*) to form said semiconductor device.

Said semiconductor device may be an electronic power device.

Said electronic power device may be a diode or a MOS-FET.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A process for manufacturing a silicon carbide semiconductor device, comprising:

providing a silicon carbide wafer, having a substrate;

carrying out an epitaxial growth for formation on the substrate of an epitaxial layer, having a top surface, propagation of dislocations from the substrate towards the top surface occurring during said epitaxial growth with consequent formation of surface damages;

subsequent to the carrying out the epitaxial growth, removing a surface portion of the epitaxial layer starting from said top surface, so as to remove the surface damages at said top surface and define a resulting top surface substantially free of defects, wherein the removing the surface portion of the epitaxial layer includes carrying out Chemical Mechanical Polishing (CMP) of the top surface of the epitaxial layer with the following parameters: rate of rotation of a polishing pad<70 rpm; rate of rotation of a supporting head<60 rpm; force of thrust of the supporting head on the polishing pad about 3 kgf; and flow of a polishing compound<100 ml/min;

prior to said CMP, cleaning the top surface of the epitaxial layer with a high-pressure jet of liquid;

drying the top surface with a chemical agent;

subsequent to said CMP, washing the resulting top surface, wherein, following said CMP step and said washing, the resulting top surface has a value of roughness lower than 0.1 nm; and forming a power MOSFET with the epitaxial layer including:

forming a dielectric layer of a power MOSFET by oxidizing the top surface after the CMP; and forming an electrode of the power MOSFET on the epitaxial layer.

2. The process according to claim 1, wherein said surface damages are pits due to propagation of the dislocations starting from said substrate towards said top surface during said epitaxial growth.

3. The process according to claim 1, wherein the removed surface portion of the epitaxial layer has a thickness between 100 nm and 500 nm.

4. The process according to claim 3, wherein said thickness is equal to 300 nm.

5. The process according to claim 2, wherein the removing the surface portion of the epitaxial layer includes carrying out Chemical Mechanical Polishing (CMP) of the top surface of the epitaxial layer.

6. The process according to claim 5, wherein said CMP is carried out using a polishing compound free of particles and having a pH lower than 5.

7. The process according to claim 6, wherein, during said CMP, the wafer is pressed against the polishing pad by the supporting head with a pressure between 1 psi and 3 psi.

8. The process according to claim 5, wherein said CMP is carried out at a temperature lower than 50° C.

9. The process according to claim 1, wherein said epitaxial growth is carried out with Chemical Vapor Deposition (CVD).

10. The process according to claim 1, wherein said epitaxial layer is made of 4H—SiC.

11. The process according to claim 1, further comprising, following the removing a surface portion of the epitaxial layer, carrying out further processing operations starting from the resulting top surface to form said semiconductor device.

12. A method, comprising:

forming an epitaxial layer on a silicon carbide substrate, a threading-screw dislocation defect in the substrate extending through the epitaxial layer and forming a pit at a surface of the epitaxial layer having a diameter less than 30 nm;

removing the pit at the surface of the epitaxial layer by performing Chemical Mechanical Polishing (CMP) to remove a surface portion of the epitaxial layer, thereby defining a top surface of the epitaxial layer that is substantially free of defects, wherein the removing the surface portion of the epitaxial layer includes carrying out Chemical Mechanical Polishing (CMP) of the top surface of the epitaxial layer with the following parameters: rate of rotation of a polishing pad<70 rpm; rate of rotation of a supporting head<60 rpm; force of thrust of the supporting head on the polishing pad about 3 kgf; and flow of a polishing compound<100 ml/min;

prior to said CMP, cleaning the top surface of the epitaxial layer with a high-pressure jet of liquid;

drying the top surface with a chemical agent;

subsequent to said CMP, washing the resulting top surface, wherein, following said CMP step and said washing, the resulting top surface has a value of roughness lower than 0.1 nm; and forming a power MOSFET with the epitaxial layer including:

forming a dielectric layer of a power MOSFET by oxidizing the top surface, after the CMP; and forming an electrode of the power MOSFET on the epitaxial layer.

13. The method of claim 12, wherein the CMP is carried out using a polishing compound free of particles and having a pH lower than 5.

14. A method, comprising:

forming an epitaxial layer on a silicon carbide substrate, a threading-screw dislocation defect in the substrate extending through the epitaxial layer and forming a pit at a surface of the epitaxial layer having a diameter less than 30 nm;

removing the pit at the surface of the epitaxial layer by performing Chemical Mechanical Polishing (CMP) to remove a surface portion of the epitaxial layer, thereby defining a top surface of the epitaxial layer that is substantially free of defects, wherein the removing the surface portion of the epitaxial layer includes carrying out Chemical Mechanical Polishing (CMP) of the top surface of the epitaxial layer with the following parameters: rate of rotation of a polishing pad<70 rpm; rate of rotation of a supporting head<60 rpm; force of thrust of the supporting head on the polishing pad about 3 kgf; and flow of a polishing compound<100 ml/min;

prior to said CMP, cleaning the top surface of the epitaxial layer with a high-pressure jet of liquid;

drying the top surface with a chemical agent;

subsequent to said CMP, washing the resulting top surface, wherein, following the washing, the resulting top surface has a value of roughness lower than 0.1 nm; and forming a power MOSFET with the epitaxial layer including:

forming a dielectric layer of a power MOSFET by oxidizing the top surface, after the CMP; and forming an electrode of the power MOSFET on the epitaxial layer.

15. The method of claim 14, further comprising:

forming an oxide layer on the top surface of the epitaxial layer, subsequent to the washing the resulting top surface.

16. The process according to claim 14, wherein said epitaxial layer is formed with Chemical Vapor Deposition (CVD).

17. The process according to claim 14, wherein said epitaxial layer is made of 4H—SiC.

* * * * *